US009666264B1

(12) United States Patent
Jeter et al.

(10) Patent No.: US 9,666,264 B1
(45) Date of Patent: May 30, 2017

(54) APPARATUS AND METHOD FOR MEMORY CALIBRATION AVERAGING

(71) Applicant: Apple Inc., Cupertino, CA (US)

(72) Inventors: Robert E. Jeter, Santa Clara, CA (US); Kai Lun Hsiung, Fremont, CA (US); Rakesh L. Notani, Sunnyvale, CA (US); Xingchao C. Yuan, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/187,886

(22) Filed: Jun. 21, 2016

(51) Int. Cl.
*G11C 7/10* (2006.01)
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096
USPC ............... 365/193, 189.05, 189.011, 189.15, 365/189.17, 189.07, 189, 9, 191, 194
See application file for complete search history.

(56) References Cited

U.S. PATENT DOCUMENTS

| 6,600,681 | B1 * | 7/2003 | Korger | G11C 7/1066 365/193 |
| 7,453,746 | B2 | 11/2008 | Ivanov | |
| 8,565,033 | B1 * | 10/2013 | Manohararajah | G11C 29/028 365/129 |
| 9,007,855 | B2 | 4/2015 | Kumar et al. | |
| 9,251,906 | B1 * | 2/2016 | Jain | G11C 7/22 |
| 2016/0048334 | A1 * | 2/2016 | Jeter | G06F 3/0604 711/163 |
| 2016/0132379 | A1 * | 5/2016 | Chen | G06F 11/0772 714/54 |

* cited by examiner

*Primary Examiner* — Fernando Hidalgo
(74) *Attorney, Agent, or Firm* — Meyertons, Hood, Kivlin, Kowert & Goetzel, P.C.; Erik A. Heter

(57) ABSTRACT

A method and apparatus for memory calibration averaging is disclosed. In one embodiment, a memory subsystem includes a memory and a memory controller. The memory controller includes a calibration control circuit that periodically performs calibrations of the memory subsystem. Calibration may be performed for a delay applied to a data strobe used to synchronized transfers of data between the memory controller and the memory, and a reference voltage used to distinguish between a logic 0 and a logic 1 during memory reads. Following the performance of a calibration, the values of the delay and the reference voltage may be set based on an average of a most recent number of calibrations.

15 Claims, 6 Drawing Sheets

APPARATUS AND METHOD FOR MEMORY CALIBRATION AVERAGING

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis. Additionally, since some systems have multiple operating points (e.g., combinations of clock frequency and supply voltage), calibrations may also be performed upon a switch from one operating point to another.

A method and apparatus for memory calibration averaging is disclosed. In one embodiment, a memory subsystem includes a memory and a memory controller. The memory controller includes a calibration control circuit that periodically performs calibrations of the memory subsystem. Calibration may be performed for a delay applied to a data strobe used to synchronized transfers of data between the memory controller and the memory, and a reference voltage used to distinguish between a logic 0 and a logic 1 during memory reads. Following the performance of a calibration, the values of the delay and the reference voltage may be set based on an average of a most recent number of calibrations, rather than on the most recent calibration only.

In one embodiment, a calibration control unit includes a history buffer. Calibration results for the most recent N iterations of a calibration procedure may be stored in a corresponding N entries of the history buffer. With each calibration iteration, the information stored in the buffer may be updated, with the oldest information being evicted from the buffer and the newest information being stored therein. After updating the history buffer, an averaging circuit may calculate averages for the data stored in the buffer (e.g., the average delay, the average reference voltage). The calculated averages may be forwarded to additional calibration circuitry that sets the value of the delay and the reference voltage to be used operationally until at least the next calibration iteration.

BRIEF DESCRIPTION OF THE DRAWINGS

The following detailed description makes reference to the accompanying drawings, which are now briefly described.

Figure 1:
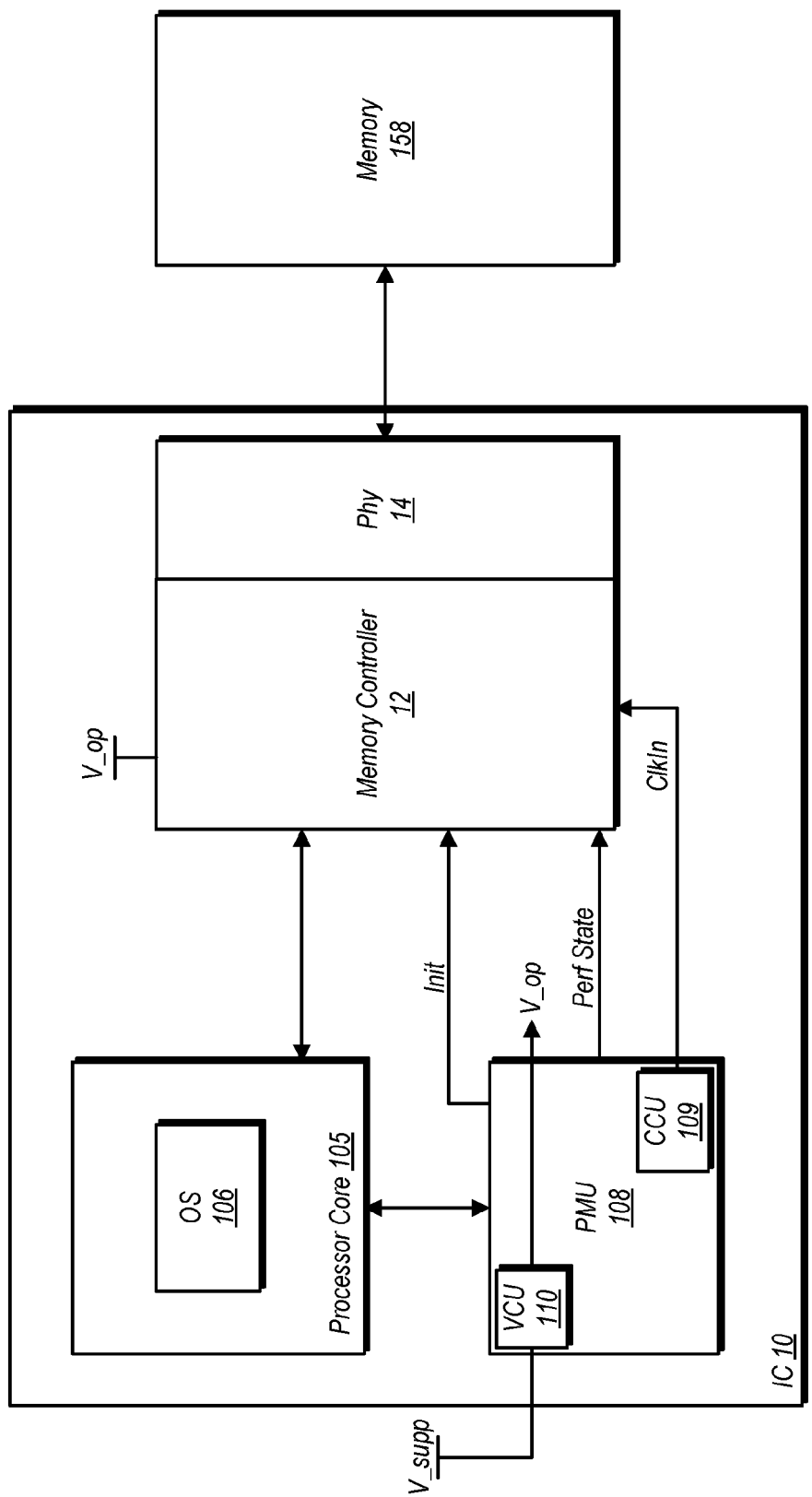
FIG. 1 is a block diagram of one embodiment of an integrated circuit and a memory coupled thereto.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 105 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and operating voltage may be adjusted during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions. Among these action, as is discussed below, is to set certain parameters to pre-calibrated values upon entry into the new state.

Figure 2:
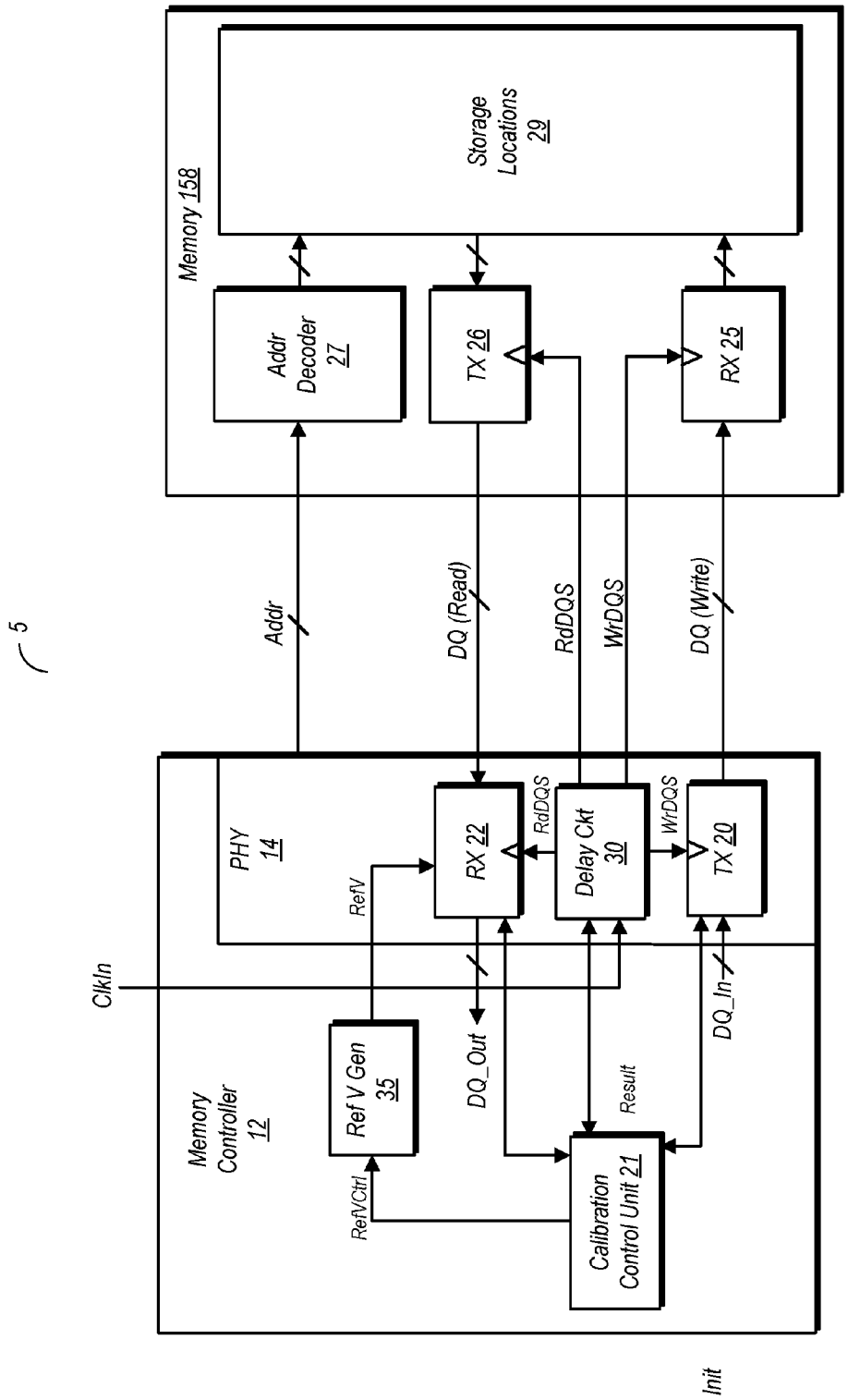
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control unit 21, which may perform various functions, including conducting various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, procedures to calibrate the data strobe signals to compensate for inherent delays may be performed at certain times during operation of memory controller 12 in order to optimize the point in time at which the data strobe signals sample data. The calibration procedures may be conducted under the control of calibration control unit 21, and involved performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, calibration control unit 21 may set the reference voltage at reference voltage generator 35 using the signal RefVCtrl. The reference voltage, RefV, or an indication of the same, may be provided from reference voltage generator 35 to receiver 22.

Figure 3:
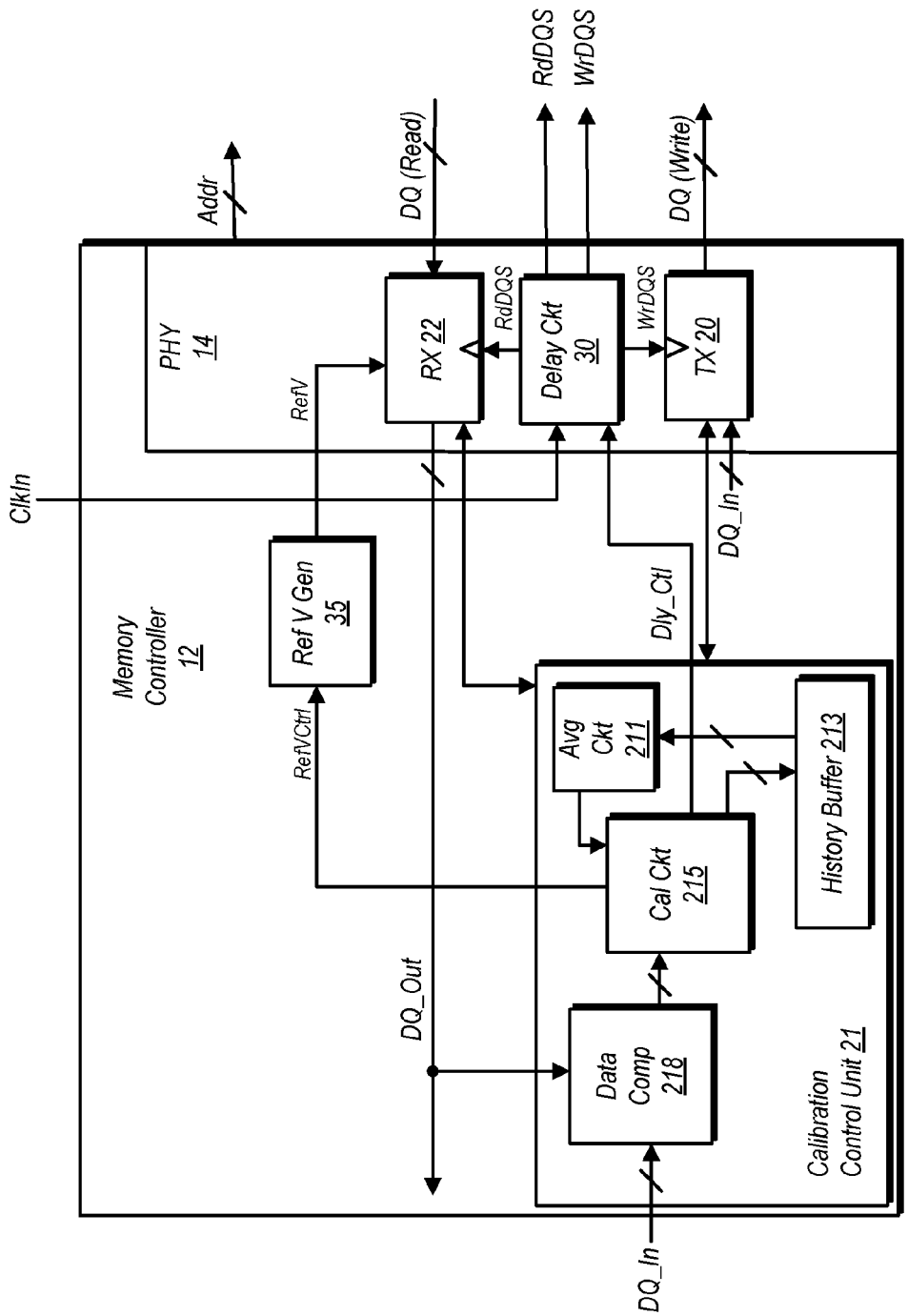
FIG. 3 is a block diagram illustrating one embodiment of a memory controller having a calibration control unit.

Turning now to FIG. 3, a block diagram illustrating one embodiment of a memory controller having a calibration control unit is illustrated. In the embodiment shown, calibration control unit 21 includes a calibration circuit 215, an averaging circuit 211, a history buffer 213, and a data comparator unit 218. Calibration circuit 215 is configured to control the reference voltage value via the RefV_val signal provided to reference voltage generator 35. Similarly, calibration circuit 215 may also control the delay value applied to the data strobe signals via the Dly_Ctl signal provided to delay circuit 30. Memory controller 12 also includes a reference voltage generator 35 which is configured to generate the reference voltage used to distinguish a logic zero from a logic one on data read from the memory. The physical interface 14 of memory controller 12 includes a receiver 22, which is coupled to receive data from memory on reads therefrom, and a transmitter 20 configured to transmit data to memory on writes thereto. Also included in physical interface 14 is a delay circuit 30, which is used to provide and control delay applied to the read data strobe signal (RdDQS) and write data strobe signal (WrDQS) during reads and writes, respectively. Delay circuit 30 includes at least one delay locked loop (DLL) 301, and may also include additional DLL's and other circuitry for controlling the delays applied to the read and write data strobes. Calibrating the delay applied to the data strobe signals may include determining/calibrating a code provided to a DLL which is used in setting the delay.

It is noted that while both read data strobe and write data strobe signals have been disclosed, the discussion below focuses on a singular data strobe signal. This singular data strobe signal may be interpreted as the read data strobe or the write data strobe. Furthermore, the methodology discussed herein may apply to either of the data strobe signals disclosed herein, and the circuitry for performing the same may be re-configured to reflect such embodiments.

The various calibrations performed may include performing writes of data to memory and subsequently reading that data back from memory. The data that is read from memory may be compared to that which was written to memory to determine and discrepancies between the two. The comparisons may be performed by data comparator 218, which is coupled to receive data to be written to the memory via the DQ_In input and data read from memory via the DQ_Out input (the latter via receiver 22). For each cycle of data ready from the memory, data comparator 218 may report any failing bits to calibration circuit 215. In turn, calibration circuit 215 may keep track of the various results for the current calibration, and based thereon, perform adjustments to the delay and or the reference voltage via the Dly_Ctl or RefVCtrl signals, respectively.

Upon completion of a particular iteration of the calibration, calibration circuit 215 may store the results in history buffer 213. In the embodiment shown, history buffer 213 may store results for up to N (e.g., 10) of the most recent calibrations. Accordingly, history buffer 213 may include N entries, each of which stores the fully calibration results for a particular iteration. For example, an entry may store a calibrated delay value and a calibrated reference value. In some embodiments, if other parameters are calibrated, the corresponding results may also be included in a given entry. Whenever a calibration is completed, the oldest calibration data stored in history buffer 213 may be evicted, with the new calibration data stored in its place. It is noted that in some embodiments, calibrations may be performed for multiple performance states. Accordingly, such embodiments may include multiple instances of history buffer 213 that may be implemented physically (i.e. separate memories) or logically (a single memory divided into separate instances of a history buffer). Accordingly, the methodology for calibration averaging discussed herein may be performed for multiple, different performance states in a single embodiment.

Averaging circuit 211 in the embodiment shown includes arithmetic circuitry configured to calculate an average for the data stored in history buffer 213. After the completion of a calibration cycle and the subsequent storage of its results, averaging circuit 211 may read data from each entry and calculate averages for the same. Thus, an average data strobe delay value of those calibrated in the most recent N calibrations may be calculated after each calibration cycle. Similarly, an average reference voltage value of those calibrated in the most recent N calibrations may also be determined. After performing these calculations, averaging circuit may provide the average values to calibration circuit 215. Thereafter, calibration circuit may set the data strobe delay and the reference voltages to their average values, rather than the most recently calibrated value. Using the average value instead of the most recent value may smooth out short-lived changes to calibrated values that may occur from corresponding short-lived changes to operating conditions. If changes to operating conditions persist, the average will change correspondingly over time.

Figure 4:
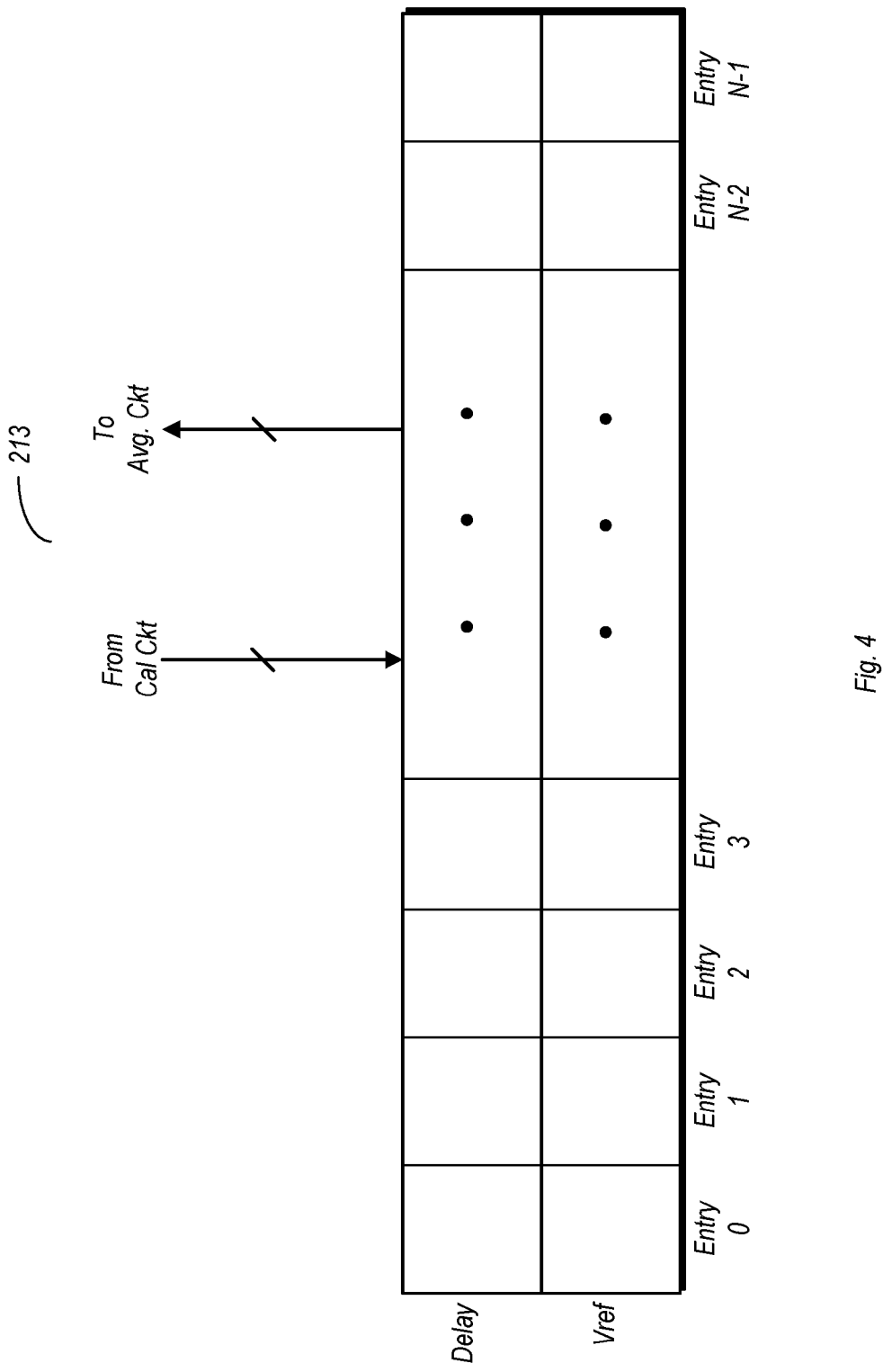
FIG. 4 is a diagram illustrating one embodiment of a history buffer.

FIG. 4 is a diagram illustrating one embodiment of a history buffer 213. In the embodiment shown, history buffer includes N entries, from Entry 0 to Entry N−1. Each entry is subdivided into a portions to store a calibrated delay value ('Delay') and a calibrated reference voltage value ('Vref'). Following each periodic calibration, the calibration circuit may write the calibrated delay and reference voltage values into an entry of history buffer 213. The chosen entry may be that which includes the oldest data. Accordingly, overwriting the oldest calibrated values from an entry effectively evicts this data and provides space for the newest data.

After the writing of the newest calibrated values, the averaging circuit may read data from history buffer 213 to obtain an average of all the values. In one embodiment, the averaging circuit may provide data from each entry for a given parameter (Delay or Vref) and calculate the average based thereon. This process may be repeated for the other parameter (or other parameters if there are more than two). In another embodiment, the average may be determined using weighted values, with the previous average being given a weight of N−1 and the most recent calibrated value for the parameter being averaged given a weight of one.

It is noted that in the case of system startup, the operation may vary from that described above due to the history buffer not yet being full. In one embodiment, the averaging could be performed based on the number of calibrations that are in the history buffer before it becomes full. In another embodiment, the system may wait to perform averaging until the history buffer is full.

Figure 5:
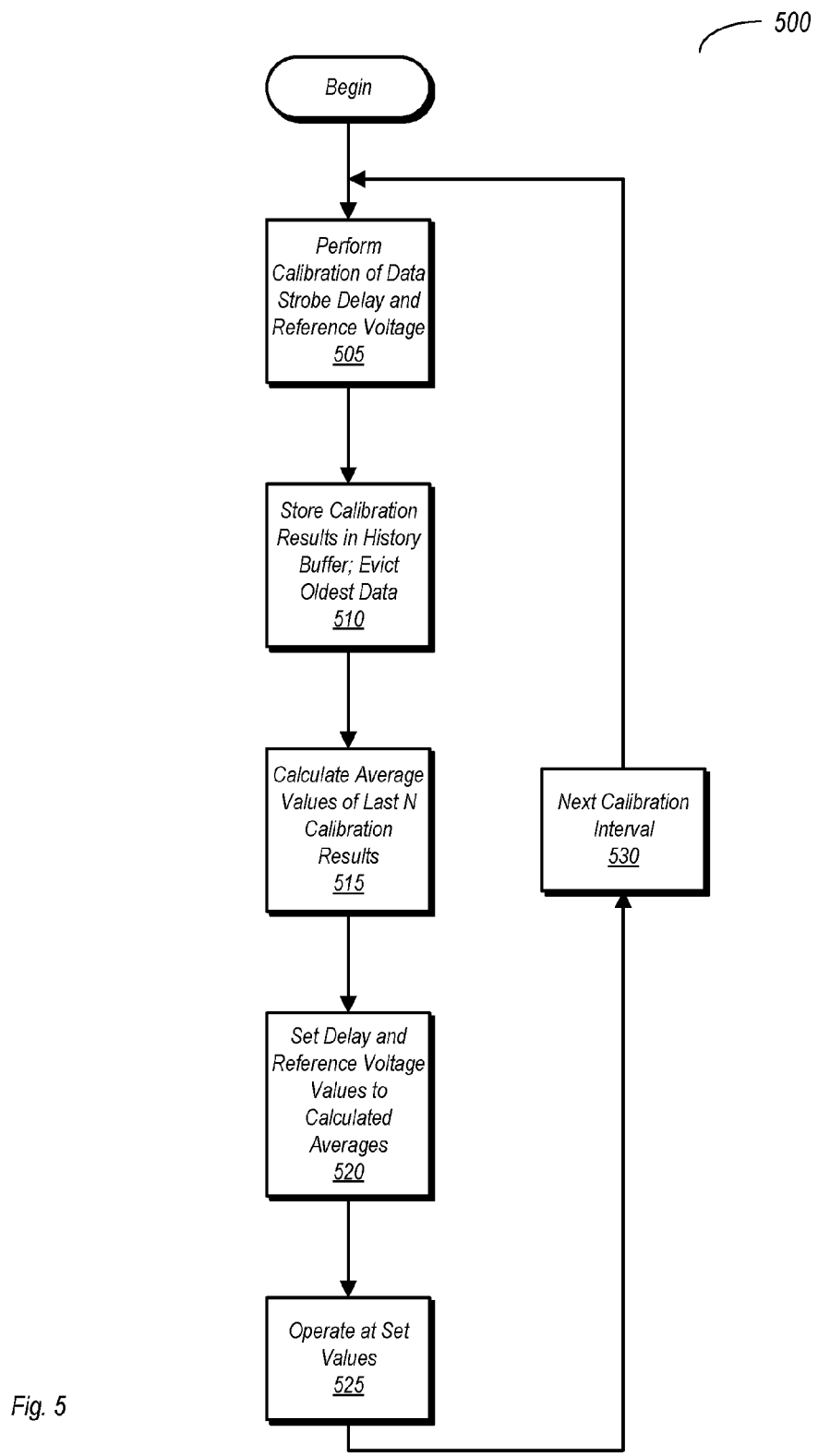
FIG. 5 is a flow diagram illustrating one embodiment of a method for determining a delay and a reference voltage based on calibration history.

FIG. 5 is a flow diagram of one embodiment of a method for calibration averaging. Method 500 as shown herein may be performed using any of the hardware embodiments discussed above. It is also possible and contemplated that method 500 may be performed with other hardware embodiments not explicitly discussed herein, and such hardware embodiments are thus considered to fall within the scope of this disclosure. It is further possible that method 500 may be performed with any combination of hardware, software, and firmware.

The beginning of method 500 as shown in FIG. 5 assumes that operation has been ongoing for some time. Method 500 begins with the performing of a calibration of a data strobe delay and a reference voltage (block 505). Each of the calibrations may include a number of writes of data to memory and reads of data therefrom, with the read data being compared to the written data. The reads and writes of data may be performed at multiple, different values of the delay and reference voltage. After completing the calibrations, the results thereof may be stored in a history buffer, with the oldest data being evicted therefrom (block 510). As noted above, a history buffer may store calibration data for a most recent N iterations of the calibration procedure. Data may be stored for all calibrated values, including a calibrated delay value and a calibrated reference voltage value.

After writing the current calibration data to the history buffer, the data may be read therefrom in order to compute an average of the most recent N calibrated values (block 515). This includes performing separate average calculations for the calibrated delay values and the calibrated reference voltage values. Calculating the averages of these values may be performed in parallel or sequentially. Upon completion, the calculated averages may be provided to a calibration circuit or other control circuit, which then sets the values to their calculated averages (block 520). Thus, the operating delay value may be set to the average of the most recent N calibrated delay values. Similarly, the reference voltage value may be set to the average of the most recent N calibrated reference voltage values. These values may be uses for normal operation (block 525). Operation using these average values may continue until the next calibration interval (block 530). Thereafter, the method returns to block 505 and is repeated.

Figure 6:
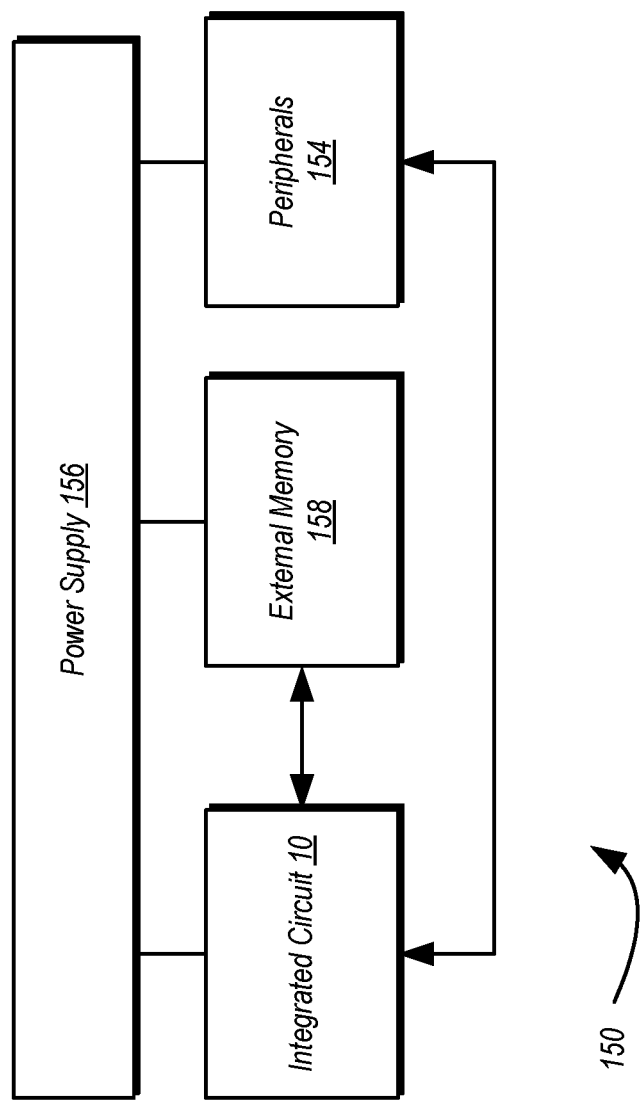
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a memory; and
a memory controller coupled to the memory and configured to convey a data strobe signal to the memory during transfers of data to and from the memory, wherein the memory controller includes:
a calibration control circuit configured to perform periodic calibrations of a delay applied to the data strobe signal and a reference voltage used to distinguish a logic zero from a logic one in data read from the memory, and further configured to set the delay and the reference voltage to an average value of a most recent N calibration iterations;
wherein the calibration control circuit comprises:
a calibration history circuit configured to store results for each iteration of the most recent N calibration iterations; and
a calibration circuit configured to perform the periodic calibrations, wherein the calibration circuit is configured to, during performance of a calibration, cause multiple reads of data at a plurality of different values of the reference voltage.

2. The apparatus as recited in claim 1, wherein the calibration history circuit comprises N entries, wherein N is an integer number, and wherein each of the N entries is configured to store calibration results for one of the most recent N calibration iterations.

3. The apparatus as recited in claim 1, wherein the calibration control circuit further comprises a calibration averaging circuit configured to calculate an average of calibration results for each iteration of the most recent N calibration iterations.

4. The apparatus as recited in claim 1, wherein the calibration circuit is further configured to, during performance of a calibration, cause multiple writes and reads of data at a plurality of different values of the delay.

5. A method comprising:
performing, by a calibration circuit in a memory subsystem, periodic calibrations of a delay applied to the data strobe signal and a reference voltage used to distinguish a logic zero from a logic one in data read from a memory in a memory subsystem, wherein performing the periodic calibrations comprises the calibration circuit causing multiple reads of data at a plurality of different values of the reference voltage; and
subsequent to performing each calibration, setting the delay and reference voltages to calculated average values based on a history of values that includes current calibrated values of the delay and the reference voltage.

6. The method as recited in claim 5, further comprising storing, in a history buffer, results for each of a most recent N iterations of the periodic calibrations.

7. The method as recited in claim 6, further comprising, subsequent to each iteration of the periodic calibrations, calculating an average value of each of the delay and the reference voltage based on the results stored in the history buffer.

8. The method as recited in claim 6, further comprising, subsequent to each iteration of the periodic calibrations:
storing results for a most recently performed calibration in the history buffer; and
evicting oldest results from the history buffer.

9. The method as recited in claim 5, wherein performing each calibration further comprises performing a plurality of writes to and a plurality of reads from the memory at different delay values.

10. A system comprising:
a memory subsystem having a memory coupled to a memory controller, wherein the memory controller is configured to write data to the memory and read data from the memory, and wherein the memory controller includes:
a calibration control unit comprising circuitry configured to perform periodic calibrations of a reference voltage and delay applied to a data strobe signal, wherein the data strobe signal is used to synchronize transfers of data between the memory controller and the memory, and wherein the reference voltage is used to distinguish a logic zero from a logic one in data read from the memory;
wherein the calibration control unit is further configured to set the delay and the reference voltage to an average value of a most recent N iterations of the periodic calibrations; and
wherein the calibration control unit includes a calibration circuit configured to perform each of the periodic calibrations, wherein the calibration circuit is configured to, during performance of a calibration, cause multiple reads of data at a plurality of different values of the reference voltage.

11. The system as recited in claim 10, wherein the calibration circuit is configured to set the delay and reference voltage values subsequent to performing a periodic calibration.

12. The system as recited in claim 11, wherein the calibration control unit includes a history buffer having N entries each configured to store calibration results for one of the most recent N iterations of the periodic calibrations, wherein subsequent to performing a calibration, the calibration control unit circuit is configured to:
evict oldest results from the history buffer; and
store results for a most recently performed calibration in the history buffer.

13. The system as recited in claim 12, further comprising an averaging circuit configured to calculate average values of the delay and the reference voltage based on the calibration results stored in the history buffer, and further configured to convey the calculated average values to the calibration circuit.

14. The system as recited in claim 13, wherein the calibration circuit is configured to set values for the delay and the reference voltage responsive to receiving updated average value from the averaging circuit.

15. The system as recited in claim 10, wherein the calibration circuit is configured to, during performance of a calibration, cause multiple writes and reads of data at a plurality of different values of the delay.

* * * * *